United States Patent
He et al.

(10) Patent No.: US 10,725,084 B2
(45) Date of Patent: Jul. 28, 2020

(54) FAULT DIAGNOSIS METHOD FOR SERIES HYBRID ELECTRIC VEHICLE AC/DC CONVERTER

(71) Applicant: Wuhan University, Hubei (CN)

(72) Inventors: Yigang He, Hubei (CN); Yaru Zhang, Hubei (CN); Hui Zhang, Hubei (CN); Kaipei Liu, Hubei (CN)

(73) Assignee: WUHAN UNIVERSITY, Hubei (CN)

(*) Notice: Subject to any disclaimer, the term of this patent is extended or adjusted under 35 U.S.C. 154(b) by 41 days.

(21) Appl. No.: 16/003,115

(22) Filed: Jun. 8, 2018

(65) Prior Publication Data
US 2019/0242936 A1    Aug. 8, 2019

(30) Foreign Application Priority Data

Feb. 5, 2018  (CN) .......................... 2018 1 0111240

(51) Int. Cl.
| | | |
|---|---|---|
| *G01R 31/00* | (2006.01) | |
| *G07C 5/08* | (2006.01) | |
| *G06N 3/04* | (2006.01) | |
| *G01R 31/40* | (2020.01) | |
| *B60K 6/22* | (2007.10) | |
| *B60K 6/46* | (2007.10) | |

(52) U.S. Cl.
CPC ........... *G01R 31/007* (2013.01); *G01R 31/40* (2013.01); *G06N 3/04* (2013.01); *G07C 5/0808* (2013.01); *B60K 6/22* (2013.01); *B60K 6/46* (2013.01); *B60Y 2200/92* (2013.01); *Y02T 10/6217* (2013.01); *Y10S 903/904* (2013.01)

(58) Field of Classification Search
CPC ........ G01R 31/007; G01R 31/40; G06N 3/04; G07C 5/0808; B60K 6/22; B60K 6/46; B60Y 2200/92; Y10S 903/904
See application file for complete search history.

(56) References Cited

U.S. PATENT DOCUMENTS 5,774,357 A * 6/1998 Hoffberg ............... G06F 3/0482
                                                                713/600
6,031,386 A * 2/2000 Cole, Jr. ............ G01R 31/3004
                                                              324/762.02

(Continued)

FOREIGN PATENT DOCUMENTS

CN           202394434 U  *  8/2012

*Primary Examiner* — Behrang Badii
*Assistant Examiner* — Daniel L Greene
(74) *Attorney, Agent, or Firm* — JCIPRNET (57) ABSTRACT

A fault diagnosis method for a series hybrid electric vehicle AC/DC (Alternating Current/Direct Current) converter, implementing identifying and diagnosing of an open circuit fault of a power electronic components in an AC/DC converter, and including the following steps: first, establishing a simulation model for a series hybrid electric vehicle AC/DC converter, and selecting a DC bus output current as a fault characteristic; then classifying fault types according to a quantity and locations of faulty power electronic components; next, decomposing the fault characteristic, that is, the DC bus output current by means of fast Fourier transform to different frequency bands, and selecting harmonic ratios of the different frequency bands as fault diagnosing eigenvectors; and finally, identifying the fault types by using a genetic algorithm-based BP (Back Propagation) neural network.

3 Claims, 7 Drawing Sheets

(56) References Cited

U.S. PATENT DOCUMENTS

| | | | | |
|---|---|---|---|---|
| 10,020,650 B2* | 7/2018 | Roesner | ............... | H02J 7/0083 |
| 2003/0107352 A1* | 6/2003 | Downer | ............. | B60L 15/2045 |
| | | | | 322/40 |
| 2010/0070212 A1* | 3/2010 | Williams | ............... | G01R 31/42 |
| | | | | 702/58 |
| 2012/0235613 A1* | 9/2012 | Huang | ................ | B60L 3/0092 |
| | | | | 318/400.26 |
| 2012/0250203 A1* | 10/2012 | Makihara | ........... | G01R 31/3835 |
| | | | | 361/86 |
| 2016/0236790 A1* | 8/2016 | Knapp | ................ | B64C 11/001 |
| 2017/0123058 A1* | 5/2017 | Yavari | .................... | G01S 13/56 |

* cited by examiner

FAULT DIAGNOSIS METHOD FOR SERIES HYBRID ELECTRIC VEHICLE AC/DC CONVERTER

CROSS-REFERENCE TO RELATED APPLICATION

This application claims the priority benefit of China application serial no. 201810111240.7, filed on Feb. 5, 2018. The entirety of the above-mentioned patent application is hereby incorporated by reference herein and made a part of this specification.

BACKGROUND OF THE INVENTION

1. Field of the Invention

The present invention relates to the field of power electronic circuit fault diagnosis, and in particular, to a fault diagnosis method for a series hybrid electric vehicle AC/DC (Alternating Current/Direct Current) converter.

Currently, the world automobile industry is in a development period of technology revolution and industry adjustment. Safety, environment-friendliness, energy efficiency, and intelligence become a common concern in the world automobile industry. Hybrid electric vehicles, due to the advantages such as low power consumption, low pollution, and high automation, are a key object for research and development in the automobile industry. An electronic drive system of a hybrid electric vehicle mainly includes an engine, an AC permanent magnet synchronous motor, a generator, a fuel cell, and relevant AC/DC converters. The motor and a three-phase voltage-type inverter used in the generator are integrated into one module. The inverter is usually a PWM-controlled (Pulse Width Modulation-controlled) voltage-type inverter including an IGBT (Insulated Gate Bipolar Transistor) that has an anti-parallel connect flyback diode. Such an inverter is characterized in simple in line, high in efficiency, and the like, enabling electric vehicles to become a new application field of power electronic technologies.

During normal operating of the electronic drive system of the hybrid electric vehicle, if any part of the system, such as the generator, the inverter, a rectifier, or the motor goes faulty, reliable operating of the drive system may be affected. A fault in the system may further expand if not being detected and corrected in time. This may cause changes of a status of the upper-layer system and cause function failure, thereby affecting normal operating of the vehicle and even threatening safety. Therefore, accurate, reliable, and fast diagnosis of a fault in the drive system can effectively improve operating of the vehicle.

SUMMARY OF THE INVENTION

In view of the disadvantage of the fault diagnosis of an existing drive system, the present invention provides a fault diagnosis method for a series hybrid electric vehicle AC/DC converter, to diagnose and identify a fault of a series hybrid electric vehicle AC/DC converter, and mainly to deal with an open circuit fault of a power component of a power electronic circuit. The method is convenient in calculation and high in accuracy, and can effectively diagnose a quantity and relative locations of faulty power electronic components.

Technical solutions used in the present invention to resolve the foregoing technical problem are as follows.

A fault diagnosis method for a series hybrid electric vehicle AC/DC converter, including the following steps:
(1) establishing a simulation model for the series hybrid electric vehicle AC/DC converter, and selecting a DC bus output current as a fault characteristic;
(2) classifying fault types according to a quantity and locations of faulty power electronic components;
(3) decomposing the fault characteristic, that is, the DC bus output current by means of fast Fourier transform to different frequency bands, and selecting harmonic ratios of the different frequency bands as fault diagnosing eigenvectors;
(4) identifying the fault types by using a genetic algorithm-based BP (Back Propagation) neural network.

According to the foregoing solution, the method in the step (3) is specifically: selecting a harmonic ratio of f=30 kHz as a fault diagnosing eigenvector after comparing a fast Fourier transform analysis result of a DC bus output current waveform in a normal operating state with that of the DC bus output current waveform in a fault state, where k=0, 1, 2, 3, . . . , n, and 6≤n≤12.

According to the foregoing solution, the method in the step (4) is specifically:
1) determining a structure of the BP neural network, where the BP neural network is constructed as a three-layer network, and there is an approximation relation between a quantity $n_2$ of hidden-layer neurons and a quantity $n_1$ of input-layer neurons in the three-layer network:

$$n_2 = 2 \times n_1 + 1,$$

Where the quantity n1 of the input-layer neurons is an input parameter of the fault diagnosing eigenvector, $n_1 = n+1$, a structure of the three-layer neural network is $n_1 - n_2 - 2$, and there are $(n_1 * n_2 + 2 * n_2)$ weighted values and $(n_2 + 2)$ thresholds;
2) optimizing an initial weighted value and an initial threshold of the BP neural network by using the genetic algorithm, where
factors of optimizing the BP neural network by using the genetic algorithm include: population initialization, a fitness function, a selection operator, a crossover operator, and a mutation operator, where for the population initialization, binary encoding is used for individual encoding, and an input-layer and hidden-layer connection weight, a hidden-layer threshold, a hidden-layer and output-layer connection weight, and an output-layer threshold are included; for the fitness function, a norm of an error matrix between a prediction value and an expectation value of a prediction sample is selected as output of a target function, so that a residual between the prediction value and the expectation value is as small as possible when prediction is performed for the BP neural network, and an optimal weighted value and an optimal threshold that enable a value of the target function to be the smallest are obtained; and
3) performing training and prediction for the BP neural network by using the optimized weighted value and the optimized threshold.

Compared with the prior art, the present invention has the following beneficial effects: In the present invention, an error of a prediction result of the BP neural network using a weighted value and a threshold that are optimized by using the genetic algorithm is apparently smaller than an error of a prediction result using a random weighted value and a random threshold. The fault diagnosis method can effectively diagnose and identify a fault of a series hybrid electric vehicle AC/DC converter, and mainly focuses on an open circuit fault of a power component of a power electronic circuit, thereby ensuring accurate and highly-efficient fault identification and convenience of operating.

DESCRIPTION OF THE EMBODIMENTS

The following describes the technical solutions of the present invention in detail with reference to the accompanying drawings and exemplary embodiments. The following exemplary embodiments are merely used for describing and explaining the present invention, and are not intended to limit the technical solutions of the present invention.

Figure 1:
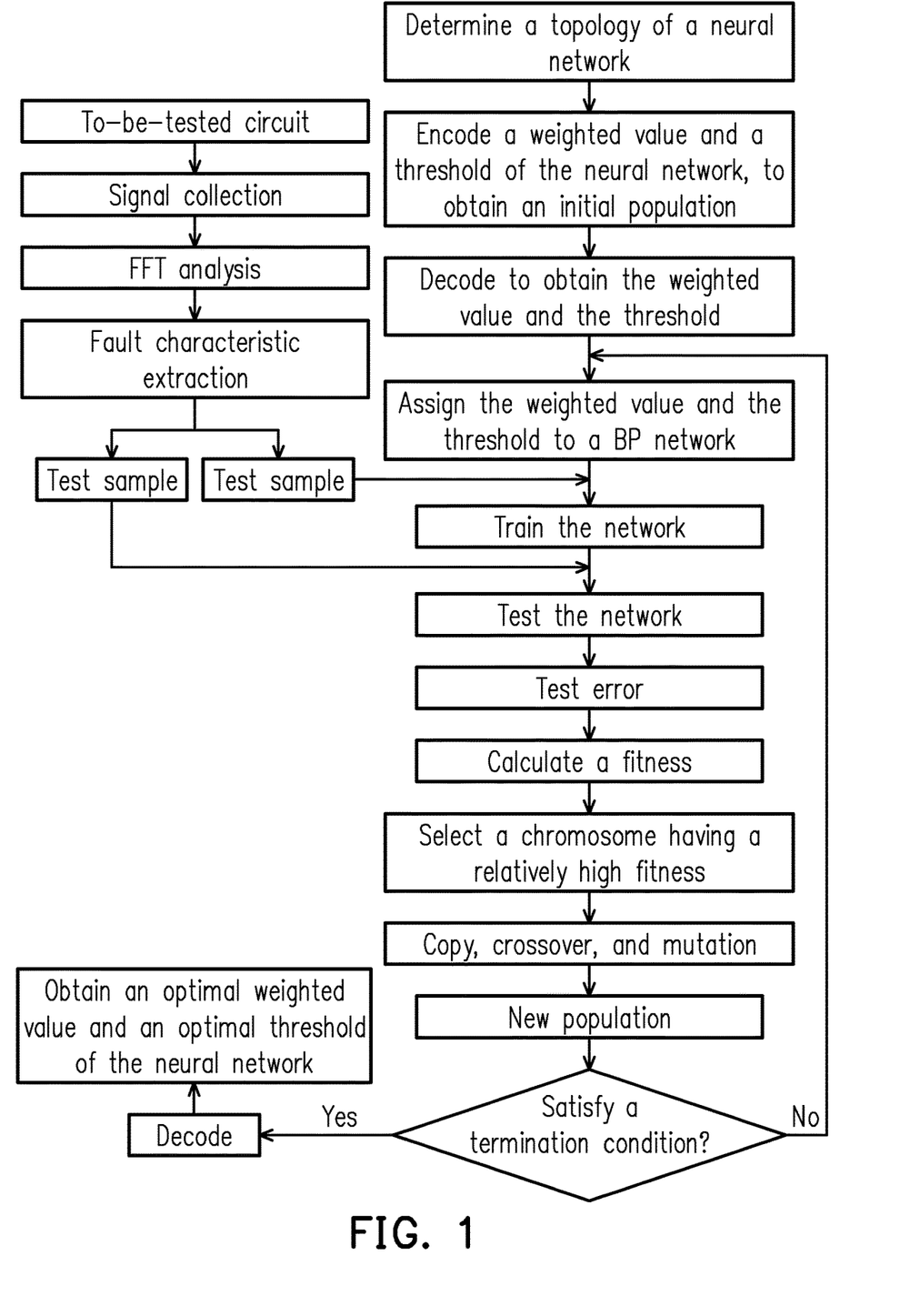
FIG. 1 is a flowchart of a fault diagnosis method according to the present invention.
Figure 2:
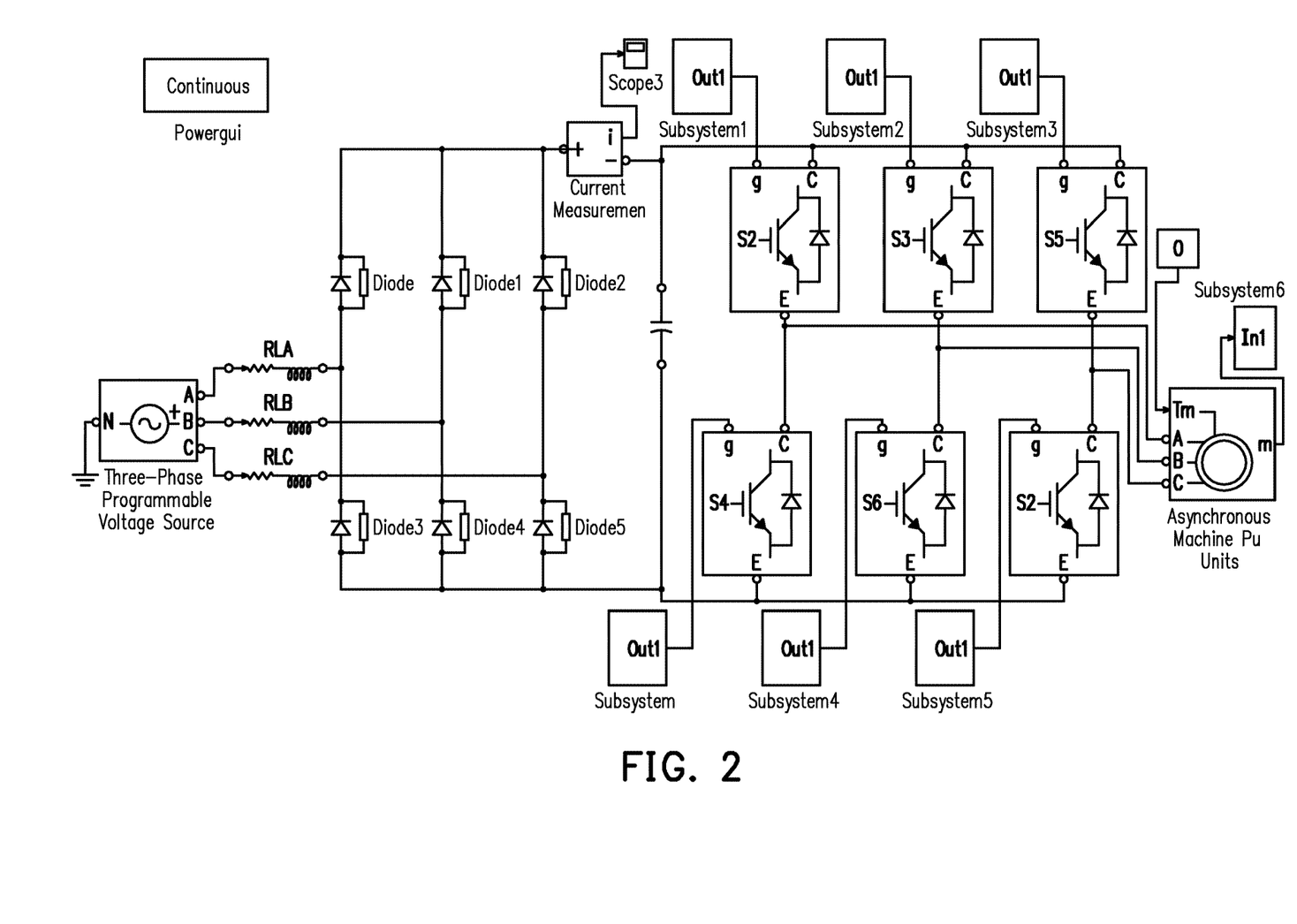
FIG. 2 is a simulation topology view of an AC/DC converter.

As shown in FIG. 1, FIG. 1 shows a fault diagnosis method for a series hybrid electric vehicle AC/DC converter according to the present invention, including the following steps:

(1) establishing a simulation model for a series hybrid electric vehicle AC/DC converter. Because capacitance existing between a rectifier and an inverter compensates for voltage drop and harmonic changes caused by a fault, normal detection of the fault is affected. In this case, a DC bus output current, that is, a DC current signal $I_{dc}$ is selected as a fault characteristic. An AC/DC converter is a core device for implementing power conversion and speed adjustment and frequency modulation in an electronic drive system of a series hybrid electric vehicle. A simulation topology structure of the AC/DC converter is shown in FIG. 2, where an AC system source voltage is 220 V, and a frequency is 50 Hz.

(2) classifying fault types according to a quantity and locations of faulty power electronic components. This is specifically as follows:

For an AC/DC converter, a most common power fault is an open circuit fault or single-phase-to-ground fault of a power electronic component. In the present invention, a fault characteristic of open circuit of a power electronic component is focused on and analyzed. For a three-phase voltage-type bridge inverter circuit on the right of the topology structure, an IGBT is used as a switching device, and there are 26 types of switch operating states of six switching devices S1 to S6. The switch operating states are divided into the following types according to locations and a quantity of power electronic components in which the open circuit fault occurs and according to DC bus output current waveforms obtained by means of simulation analysis. As shown in Table 1:

TABLE 1

Fault types and corresponding faulty waveforms of an AC/DC converter

Figure 4:
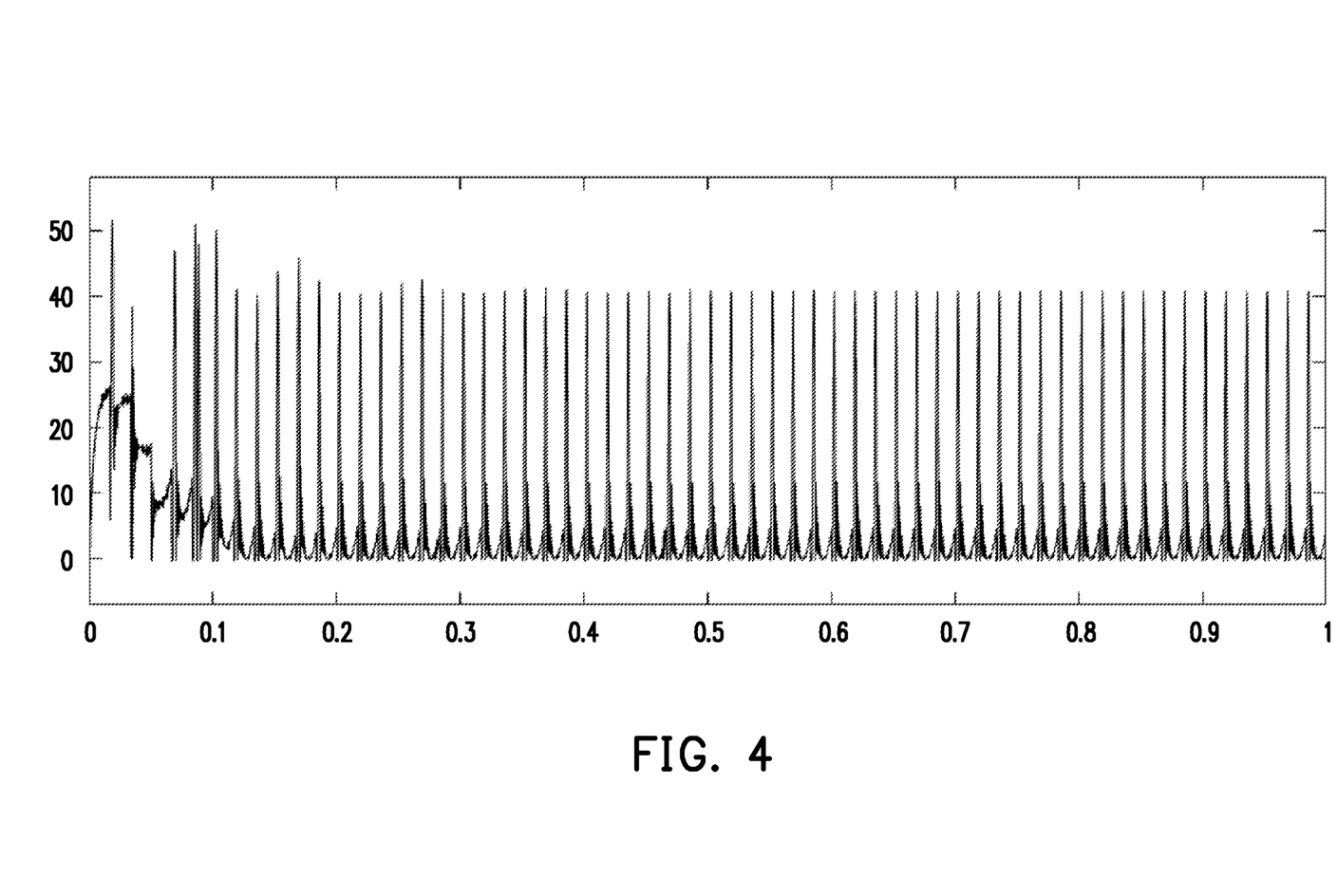
FIG. 4 is a current waveform of DC side in normal running state.
Figure 5:
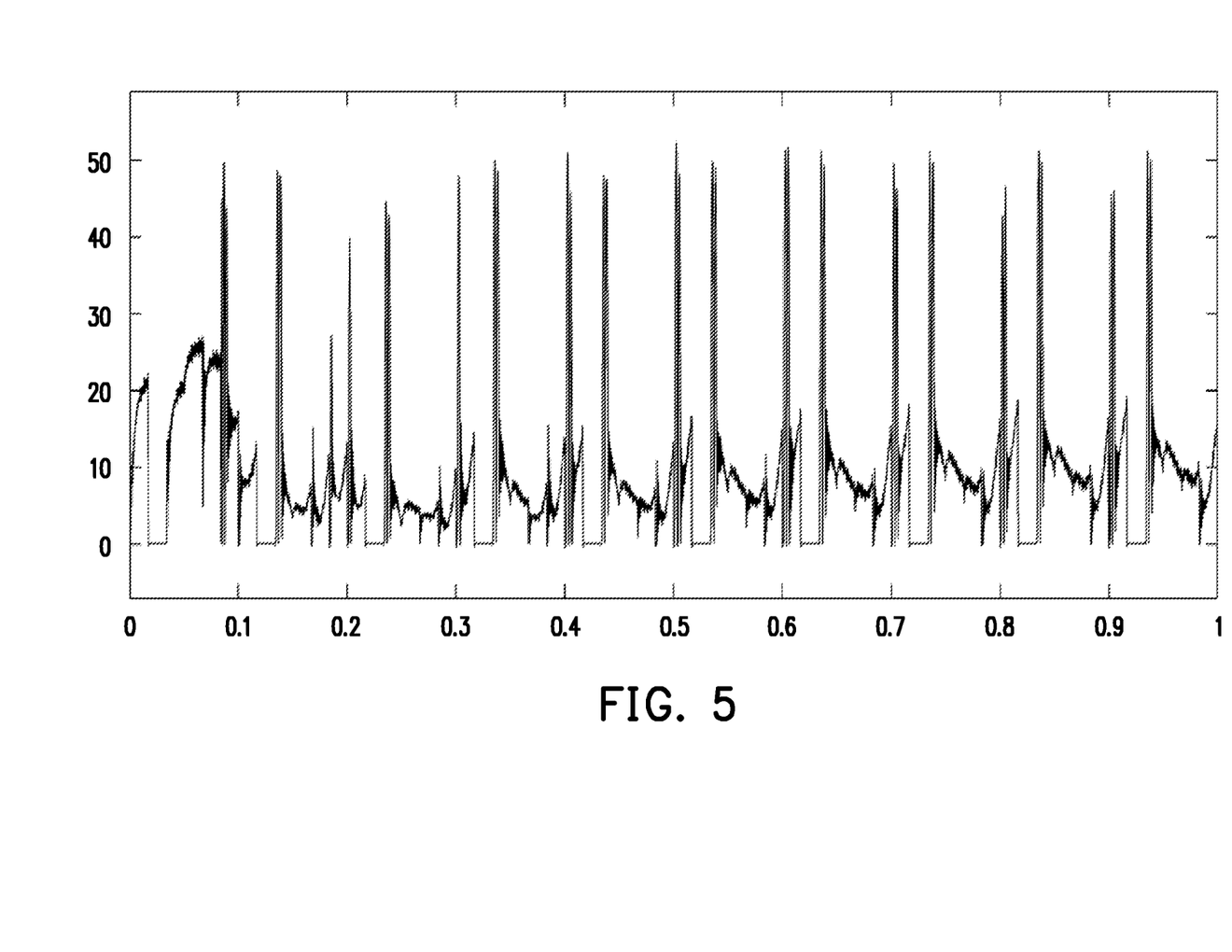
FIG. 5 is a current waveform of DC side in S1 open-circuit fault.
Figure 6:
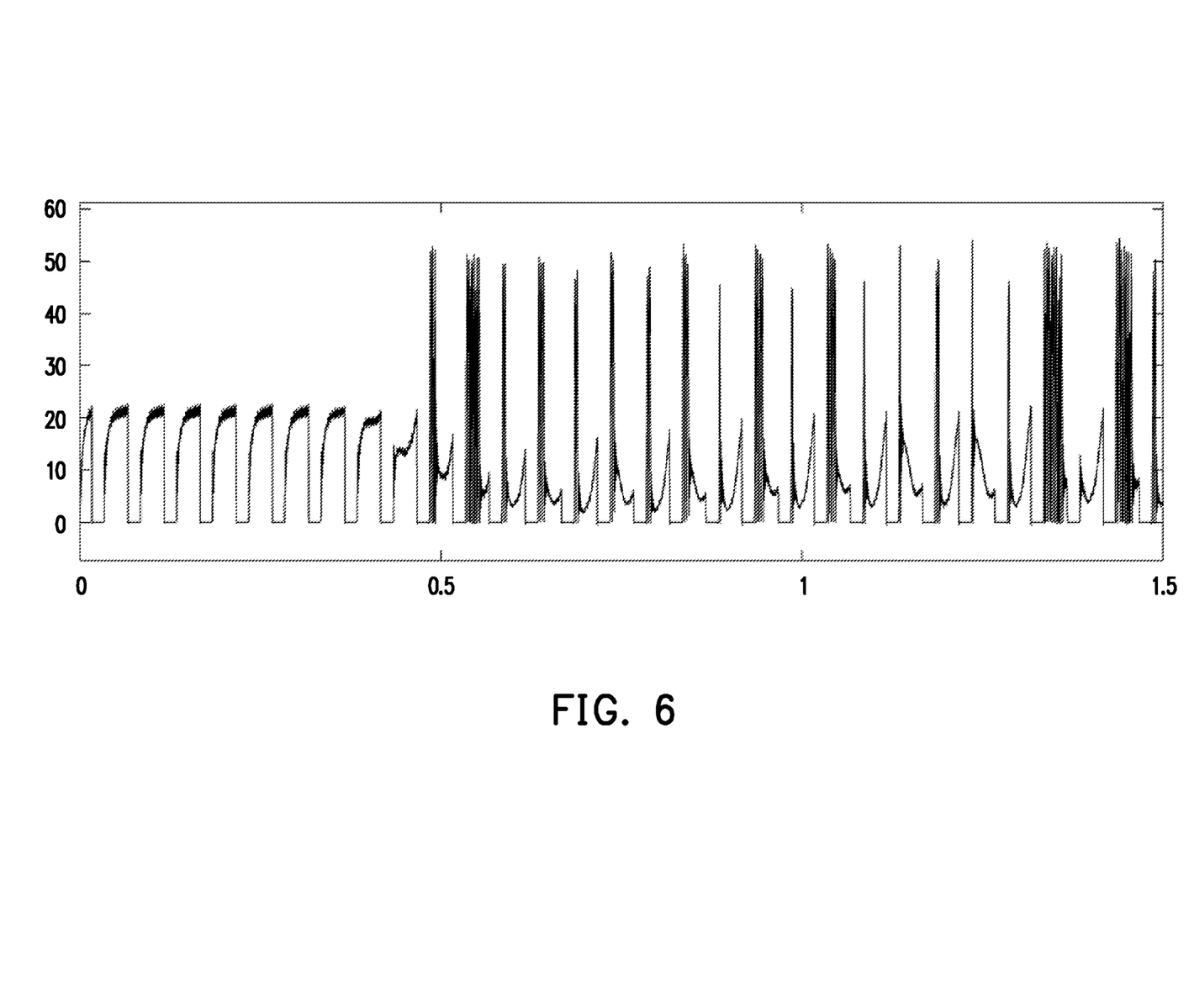
FIG. 6 is a current waveform of DC side in S1 and S4 open-circuit fault.
Figure 7:
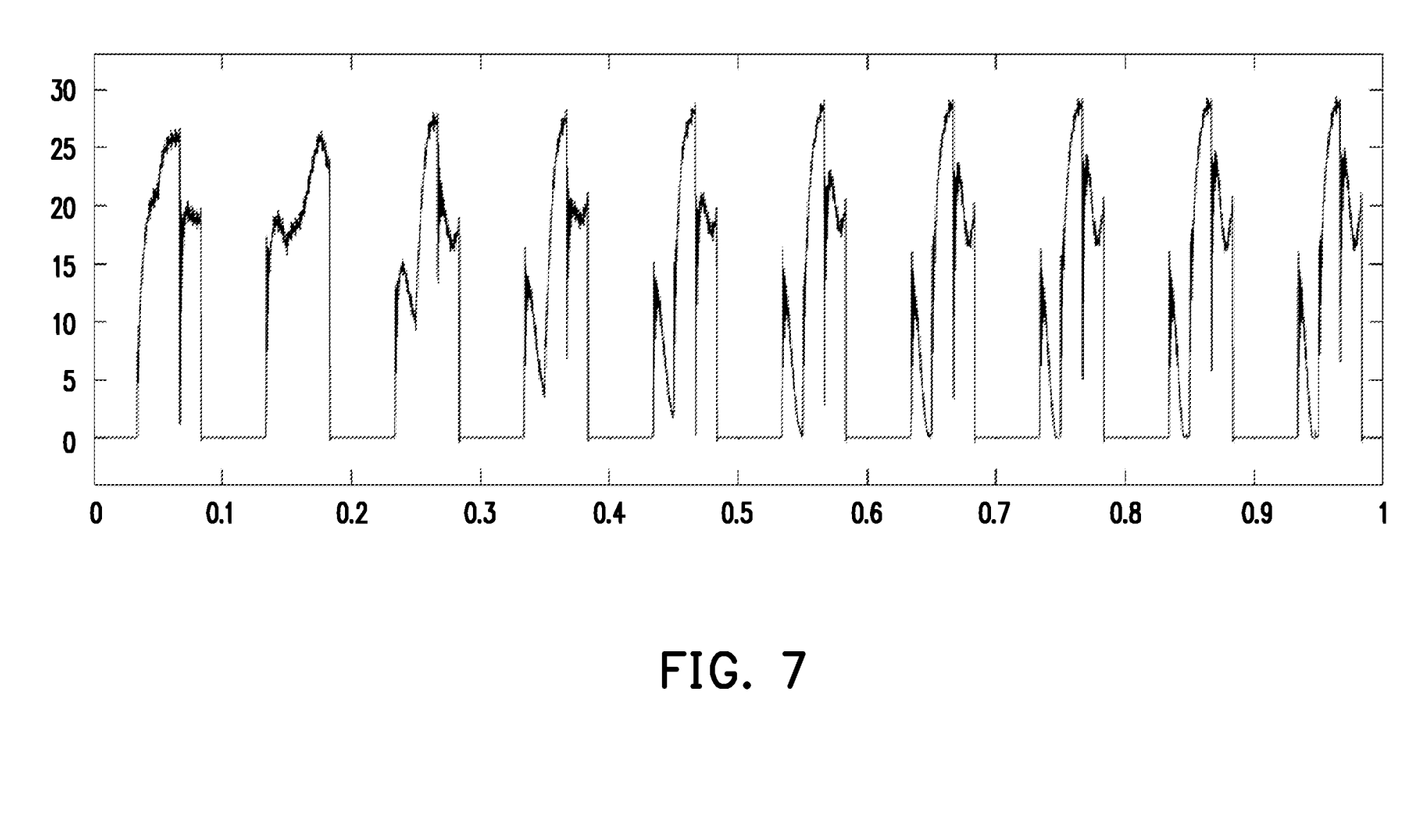
FIG. 7 is a current waveform of DC side in S3 and S5 open-circuit fault.

| Switch operating state | Serial number | S1 | S2 | S3 | S4 | S5 | S6 | Classification | Faulty waveform |
|---|---|---|---|---|---|---|---|---|---|
| F0 | 1 | T | T | T | T | T | T | G0 | as shown in FIG. 4 |
| F1 | 2 | F | T | T | T | T | T | G1 | as shown |
|  | 3 | T | F | T | T | T | T |  | in FIG. 5 |
|  | ... | ... | ... | ... | ... | ... | ... |  |  |
|  | 7 | T | T | T | T | T | F |  |  |
| F2 | 8 | F | T | T | F | T | T | G2 | as shown |
|  | 9 | T | F | T | T | F | T |  | in FIG. 6 |
|  | 10 | T | T | F | T | T | F |  |  |
|  | 11 | F | F | T | T | T | T | G3 | as shown |
|  | 12 | F | T | T | T | T | F |  | in FIG. 7 |
|  | 13 | T | F | F | T | T | T |  |  |
|  | ... | ... | ... | ... | ... | ... | ... |  |  |
|  | 21 | T | F | T | T | T | F |  |  |
|  | 22 | T | T | T | F | T | F |  |  |
| F3 | ... | F | F | F | T | T | T | G4 |  |
| F4 | ... | F | F | F | F | T | T |  |  |
| F5 | ... | F | F | F | F | F | T |  |  |
| F6 | 64 | F | F | F | F | F | F |  |  |

T represents normal operating, F represents an open circuit fault, and F0, F1, F2, F3, F4, F5, and F6 respectively represent a quantity of open circuit faults of 0, 1, 2, 3, 4, 5, and 6. A probability that three or more components concurrently go faulty is smaller than a probability of occurrence of another breaking fault, and is therefore not considered in the present invention. Cases in which all IGBT components in the system have an open circuit fault may be divided into the following types:

G0: A normal operating state, one case;

G1: One component goes faulty, and there are six cases;

G2: Two components (for example, S1 and S4) on arms of a same phase go faulty, and there are three cases;

G3: Two components (for example, S 1 and S6) on different phases go faulty, and there are twelve cases in total;

G4: Three or more components go faulty, and this is not analyzed herein.

(3) decomposing the fault characteristic, that is, the DC bus output current by means of fast Fourier transform to different frequency bands, and selecting signals of 30 k Hz (k=1, 2, 3 . . . ) frequency bands as fault diagnosing eigenvectors. This is specifically as follows:

It can be learned from the analysis in the step (2) that 22 groups of data may be obtained to form training samples of the BP neural network. When fault diagnosing eigenvectors are extracted, 30 Hz is used as a fundamental frequency. Part of DC bus current waveforms in each fault type are selected for performing FFT (Fast Fourier Transform) analysis, and subharmonic contents of f=30 k Hz (k=0, 1, 2, . . . , and 12) are extracted as the fault diagnosing eigenvectors. Training data obtained by performing FFT analysis on the DC bus output currents is shown in the following Table 2:

TABLE 2

Training data in different fault states

| Frequency (Hz) | Normal | S1 breaking | S3 breaking | S4 breaking | S1, S4 breaking | S2, S5 breaking | S1, S2 breaking | S1, S3 breaking |
|---|---|---|---|---|---|---|---|---|
| 0 | 2.8597 | 8.2390 | 7.1177 | 7.5581 | 7.0155 | 7.9970 | 9.9290 | 7.4009 |
| 30 | 0.1669 | 6.3193 | 4.8160 | 4.0456 | 4.1384 | 1.3767 | 3.4836 | 4.7630 |
| 60 | 3.9712 | 3.8835 | 2.2083 | 2.2223 | 3.6249 | 5.5343 | 0.7156 | 0.4458 |
| 90 | 0.1122 | 4.2319 | 3.0105 | 2.6492 | 1.2084 | 0.4930 | 0.3539 | 1.4848 |
| 120 | 2.0621 | 2.7777 | 1.9255 | 1.8339 | 1.5621 | 2.5585 | 0.6082 | 0.2736 |
| 150 | 0.1089 | 1.8131 | 1.3009 | 1.1428 | 1.1451 | 0.8472 | 0.1884 | 0.8478 |
| 180 | 1.6674 | 1.1723 | 1.1151 | 1.0331 | 0.8626 | 0.7124 | 0.5259 | 0.1855 |
| 210 | 0.1105 | 1.3029 | 0.6464 | 0.8501 | 0.4609 | 0.6400 | 0.1503 | 0.6022 |
| 240 | 1.6739 | 2.0188 | 1.1467 | 1.5259 | 1.1334 | 1.8903 | 0.4749 | 0.1467 |
| 270 | 0.1133 | 2.4830 | 1.4668 | 1.6632 | 0.9357 | 0.8431 | 0.1412 | 0.4516 |
| 300 | 1.4735 | 3.1508 | 2.1771 | 2.3908 | 2.9160 | 3.6816 | 0.4133 | 0.1171 |
| 330 | 0.1119 | 2.7194 | 1.7360 | 1.8667 | 1.1589 | 0.9404 | 0.1148 | 0.3582 |
| 360 | 1.3163 | 2.9033 | 2.2725 | 2.2030 | 2.7039 | 3.5276 | 0.4037 | 0.1156 |

Because four fault modes in total are analyzed in the embodiments of the present invention, the various fault types may be represented in the following forms:
No-fault state: G0 (0, 0);
One component goes faulty: G1 (0, 1);
Two components on a same phase go faulty: G2 (1, 0);
Two components on different phases go faulty: G3 (1, 1).
To test the trained network, the following groups of data are provided as test data of the network, as listed in Table 3:

TABLE 3

Sample data for testing

| Frequency (Hz) | S6 breaking | S3, S6 breaking | S2, S3 breaking | S3, S5 breaking |
|---|---|---|---|---|
| 0 | 7.5309 | 6.4599 | 8.8885 | 8.3371 |
| 30 | 4.7168 | 2.6588 | 2.3623 | 1.9969 |
| 60 | 2.3967 | 3.9707 | 0.4260 | 1.0671 |
| 90 | 2.7036 | 0.8541 | 0.2546 | 0.1589 |
| 120 | 1.7640 | 1.7102 | 0.5712 | 0.6593 |
| 150 | 1.0405 | 0.5784 | 0.1456 | 0.1678 |
| 180 | 0.6489 | 0.8373 | 0.5201 | 0.4691 |
| 210 | 0.8494 | 0.5697 | 0.1208 | 0.1601 |
| 240 | 1.2571 | 1.1196 | 0.4788 | 0.3687 |
| 270 | 1.6721 | 0.5981 | 0.1074 | 0.1575 |
| 300 | 2.0927 | 2.6680 | 0.4074 | 0.2988 |
| 330 | 1.7469 | 1.2904 | 0.0910 | 0.1514 |
| 360 | 1.9631 | 2.8361 | 0.4047 | 0.2773 |

(4) identifying the fault types by using a genetic algorithm-based BP neural network. This is specifically as follows:

Optimizing the BP neural network by using the genetic algorithm mainly includes three sections: BP neural network structure determining, weighted value and threshold optimization by using the genetic algorithm, and BP neural network training and prediction.

1) determining a structure of the BP neural network.

A mode identifying problem usually occurs during construction of the BP neural network. This problem can be well resolved by using a three-layer network. It can be learned from the step (3) that there are 13 input parameters of the samples, that is, a quantity $n_1$ of input-layer neurons is 13, and there are two output parameters. It can be calculated according to an approximation relation $n_2 = 2 \times n_1 + 1$ that a quantity $n_2$ of hidden-layer neurons is 27. Therefore, a structure of the set three-layer neural network is 13-27-2, and there are 13*27+2*27=405 weighted values and 27+2=29 thresholds, and a quantity of parameters optimized by using the genetic algorithm is 405+29=434. In addition, a transfer function of the hidden-layer neuron of the BP neural network uses an S-type tangent function, and a transfer function of an output-layer neuron uses an S-type logarithmic function.

2) optimizing an initial weighted value and an initial threshold of the BP neural network by using the genetic algorithm.

Generally, weighted values and thresholds of a neural network are random numbers in a range of [−0.5, 0.5] that are obtained by performing random initialization. The initialization parameters significantly affect training of the network and cannot be accurately obtained. Training results of the network are the same for same initial weighted values and same initial thresholds. The genetic algorithm is introduced so that an optimal weighted value and an optimal threshold are obtained. The optimizing the BP neural network by using the genetic algorithm is actually optimizing the initial weighted value and the initial threshold of the BP neural network by using the genetic algorithm.

Factors of optimizing the BP neural network by using the genetic algorithm include: population initialization, a fitness function, a selection operator, a crossover operator, and a mutation operator, where for the population initialization, binary encoding is used for individual encoding, and an input-layer and hidden-layer connection weight, a hidden-layer threshold, a hidden-layer and output-layer connection weight, and an output-layer threshold are included; for the fitness function, in the present invention, a norm of an error matrix between a prediction value and an expectation value of a prediction sample is selected as output of a target function, so that a residual between the prediction value and the expectation value is as small as possible when prediction is performed for the BP neural network.

In the present invention, assuming that encoding of each of the weighted value and the threshold is a 10-bit binary number, a binary encoding length of an individual is 4340. For specific operating parameters, refer to Table 4:

TABLE 4

Setting of operating parameters of a genetic algorithm

| Size of population | Largest quantity of generations | Quantity of binary digit bits of variable | Crossover probability | Mutation probability | Generation gap |
|---|---|---|---|---|---|
| 40 | 50 | 10 | 0.7 | 0.01 | 0.95 |

3) performing training and prediction for the BP neural network by using the optimized weighted value and the optimized threshold.

For training and testing of the BP neural network, a process of training data for the neural network is a process of constantly adjusting unknown parameters to obtain a minimum value of a cost function. A training function trains a network by using a Levenberg-Marquardt algorithm, to constantly modify a weighted value and a threshold, so that an output error of the network is the smallest and accuracy of a prediction result is ensured.

Figure 3:
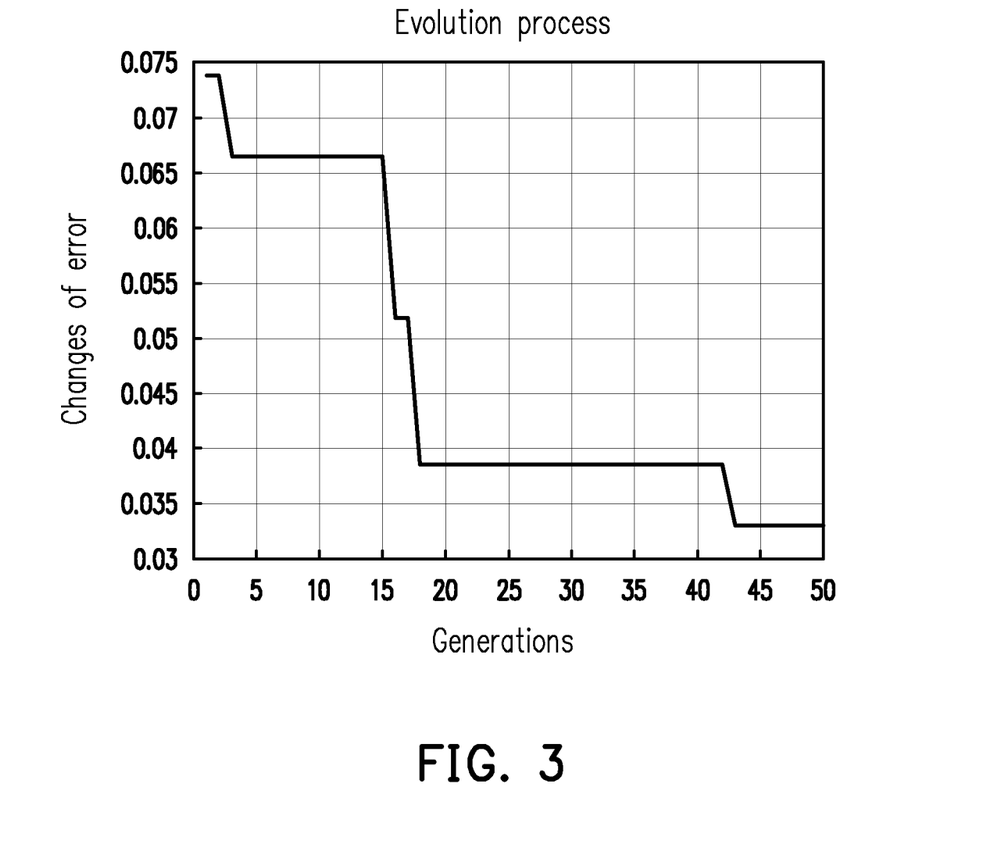
FIG. 3 is a line graph of evolution of a simulation operation result error.

According to theories of the genetic algorithm and the BP neural network, a fault diagnosis method of a BP neural network based on the genetic algorithm is implemented by programming in MATLAB software. The part of genetic algorithm uses a Sheffield genetic algorithm toolbox, and the part of BP neural network uses a neural network toolbox of the MATLAB. An operating result is shown in FIG. 3, and output results of the algorithm are optimized weighted value and threshold matrices and a minimum error of a prediction result. It can be learned from FIG. 3 that the minimum error of the prediction result of the BP neural network optimized by using the genetic algorithm is 0.033.

Comparisons between a prediction result of the BP neural network using a random weighted value and a random threshold and a prediction result of a test sample using an optimized weighted value and an optimized threshold are as follows:

TABLE 5

Comparison between simulation results

| | S6 breaking | S3, S6 breaking | S2, S3 breaking | S3, S5 breaking | Simulation error |
|---|---|---|---|---|---|
| Theoretic output | (0, 1) | (1, 0) | (1, 1) | (1, 1) | |
| A prediction result of a test sample using a random weighted value and a random threshold | (0.1874, 0.9891) | (0.9230, 0.0902) | (0.8474, 0.9770) | (0.8987, 0.9487) | 0.27308 |
| A prediction result of a test sample using an optimized weighted value and an optimized threshold | (0.0126, 0.9704) | (0.9831, 0.0002) | (0.9991, 0.9981) | (0.9991, 0.9980) | 0.033114 |

It can be learned from Table 5 that an error generated by a prediction result of the BP neural network using a weighted value and a threshold that are optimized by using the genetic algorithm is apparently smaller than an error generated by a prediction result using a random weighted value and a random threshold. Therefore, by using the neural network that is optimized by using the genetic algorithm, open circuit fault types of all components in an electronic circuit can be effectively and accurately diagnosed.

The present invention is described above by using examples with reference to the accompanying drawings, and has modifications and variations in structure and arrangement. Therefore, all equivalent technical solutions shall also fall within the scope of the present invention, and insubstantial improvements of the ideas and solution of the present invention shall fall within the protection scope of the present invention.

What is claimed is:

1. A fault diagnosis method for a series hybrid electric vehicle AC/DC (Alternating Current/Direct Current) converter, adapted to a computer system, the fault diagnosis method comprising the following steps:
    (1) establishing a simulation model for the series hybrid electric vehicle AC/DC converter, and selecting a DC bus output current as a fault characteristic;
    (2) classifying fault according to a quantity and locations of faulty power electronic components;
    (3) decomposing the fault characteristic, that is, the DC bus output current by means of fast Fourier transform to different frequency bands, and selecting harmonic ratios of the different frequency bands as fault diagnosing eigenvectors; and
    (4) identifying the fault by using a genetic algorithm-based BP (Back Propagation) neural network.

2. The fault diagnosis method for a series hybrid electric vehicle AC/DC converter according to claim 1, wherein the method in the step (3) is specifically: selecting a harmonic ratio of f=30 k Hz as a fault diagnosing eigenvector after comparing a fast Fourier transform analysis result of a DC bus output current waveform in a normal operating state with that of the DC bus output current waveform in a fault state, wherein k=0, 1, 2, 3, . . . , n, and $6 \leq n \leq 12$.

3. The fault diagnosis method for a series hybrid electric vehicle AC/DC converter according to claim 1, wherein the method in the step (4) is specifically:
    1) determining a structure of the BP neural network, wherein
    the BP neural network is constructed as a three-layer network, and there is an approximation relation between a quantity $n_2$ of hidden-layer neurons and a quantity $n_1$ of input-layer neurons in the three-layer network:

$n_2 = 2 \times n_1 + 1$, where in the quantity $n_1$ of the input-layer neurons is an input parameter of the fault diagnosing eigenvector, $n_1 = n+1$, a structure of the three-layer neural network is $n_1$-$n_2$-2, and there are ($n_1 * n_2 + 2 * n_2$) weighted values and ($n_2 + 2$) thresholds;
    2) optimizing an initial weighted value and an initial threshold of the BP neural network by using the genetic algorithm, wherein factors of optimizing the BP neural network by using the genetic algorithm comprise: population initialization, a fitness function, a selection operator, a crossover operator, and a mutation operator, wherein for the population initialization, binary encoding is used for individual encoding, and an input-layer and hidden-layer connection weight, a hidden-layer threshold, a hidden-layer and output-layer connection weight, and an output-layer threshold are comprised; for the fitness function, a norm of an error matrix between a prediction value and an expectation value of a prediction sample is selected as output of a target function, so that a residual between the prediction value and the expectation value is as small as possible when prediction is performed for the BP neural network, and an optimal weighted value and an optimal threshold that enable a value of the target function to be the smallest are obtained; and 3) performing training and prediction for the BP neural network by using the optimized weighted value and the optimized threshold.

\* \* \* \* \*